United States Patent [19]

El-Hamamsy et al.

[11] Patent Number: 5,023,566
[45] Date of Patent: Jun. 11, 1991

[54] DRIVER FOR A HIGH EFFICIENCY, HIGH FREQUENCY CLASS-D POWER AMPLIFIER

[75] Inventors: Sayed-Amr A. El-Hamamsy, Schenectady; George Jernakoff, Loudonville, both of N.Y.

[73] Assignee: General Electric Company, Schenectady, N.Y.

[21] Appl. No.: 454,614

[22] Filed: Dec. 21, 1989

[51] Int. Cl.$^5$ .............................................. H03F 3/217
[52] U.S. Cl. ................................. 330/251; 330/207 A
[58] Field of Search ................ 330/207 A, 251, 264, 330/269

[56] References Cited

U.S. PATENT DOCUMENTS

| 3,239,772 | 3/1966 | Dennis, Jr. .......................... 330/251 |
| 3,919,656 | 11/1975 | Sokol et al. ........................... 330/51 |

OTHER PUBLICATIONS

Sokal, N. O. and Sokal, A. D., "Class E-A New Class of High-Efficiency Tuned Single-Ended Switching Power Amplifiers", *IEEE Journal of Solid State Circuits*, vol. SC-10, No. 3, Jun. 1975, pp. 168-176.
Kazimierzuk, M. K. and Puczko, K., "Exact Analysis of Class E Tuned Power Amplifier at Any Q and Switch Duty Cycle", *IEEE Transactions on Circuits and Systems*, vol. CAS-34, No. 2, Feb. 1987, pp. 149-159.
Chudobiak, W. J. and Page, D. F., "Frequency and Power Limitations of Class-D Transistor Amplifiers", *IEEE Journal of Solid-State Circuits*, vol. SC-4, Feb. 1969, pp. 25-37.

*Primary Examiner*—James B. Mullins
*Attorney, Agent, or Firm*—Jill M. Breedlove; James C. Davis, Jr.; Marvin Snyder

[57] ABSTRACT

A driver circuit for a voltage-switching, high frequency Class-D power amplifier provides an input sinewave power signal and controls the transition time between switching the two active devices thereof, resulting in substantially lossless switching. The transition time is optimized by controlling the amplitude of the voltage signals at the inputs of the two active devices, depending on the output capacitance of the switching devices, the threshold voltage of the switching devices, the power output requirement, and the impedance of the resonant load network of the Class-D power amplifier.

10 Claims, 9 Drawing Sheets

DRIVER FOR A HIGH EFFICIENCY, HIGH FREQUENCY CLASS-D POWER AMPLIFIER

RELATED APPLICATIONS

This application is related to Korman et al. application entitled "Half Bridge Device Package, Packaged Devices and Circuits", Ser. No. 454,550, and to El-Hamamsy et al. application entitled "Lamp Ballast Configuration", Ser. No. 454,549, both filed concurrently herewith.

FIELD OF THE INVENTION

The present invention relates generally to high efficiency power amplifiers. More particularly, the present invention relates to a driver for a high efficiency, high frequency Class-D voltage-switching power amplifier.

BACKGROUND OF THE INVENTION

A Class-D power amplifier employs two active switching devices as a single-pole double-throw switch for generating a square wave signal. An output load network includes a resonant circuit which is tuned to the switching frequency of the devices, thus removing the harmonics of the square wave signal and resulting in a sinusoidal output signal. There are two types of Class-D power amplifiers, a voltage-switching type and a current-switching type. In the voltage-switching type, the switching devices are connected in series with a power supply, and the supply voltage is switched alternately between the respective inputs thereof. The current-switching type, which is the dual of the voltage-switching type, employs the devices in a parallel or push-pull configuration, and the supply current is alternately switched therebetween. For either type, since the switching devices of Class-D power amplifiers are driven alternately between cutoff and saturation such that one is conducting while the other one is turned off and vice versa, Class-D power amplifiers are conveniently driven by square wave signals. An input isolation transformer is conventionally used to provide the two out-of-phase driving signals.

Switching power losses at low frequencies are generally negligible for Class-D power amplifiers. However, at higher operating frequencies, switching losses are significant, thus decreasing efficiency. In particular, for a voltage-switching amplifier, the power dissipated by each switching device in discharging the output capacitance of the other switching device increases with increasing operating frequency. Moreover, as frequency increases, isolation transformers which are capable of passing the higher harmonics of the square wave drive signals must be more complex. It is generally accepted that the aforesaid shortcomings impose an upper limit on attainable efficiency for Class-D power amplifiers, e.g. 80% for high frequency, low power applications and less than 70% for high frequency, high power applications.

OBJECTS OF THE INVENTION

Accordingly, it is an object of the present invention to provide a new and improved driver for a voltage switching Class-D power amplifier which reduces device switching losses, thereby increasing efficiency.

Another object of the present invention is to provide a driver for a Class-D power amplifier which provides a sinewave input signal and optimizes the transition time between turn-off of one switching device and turn-on of the other device in order to increase efficiency.

Still another object of the present invention is to provide a driver for a Class-D power amplifier which increases efficiency at any operating frequency by controlling the switching transition time.

SUMMARY OF THE INVENTION

The foregoing and other objects of the present invention are achieved in a new driver for a voltage-switching Class-D power amplifier which provides an input sinewave power signal and controls the transition time between switching the two active devices of the half-bridge so as to improve efficiency over conventional drivers, even at high operating frequencies. In particular, the driver of the present invention is useful for driving a voltage-switching Class-D power amplifier which employs two switching devices that have capacitive gates and are connected in a half-bridge configuration. In accordance with the present invention, the transition time is optimized depending on the output capacitance of the switching devices, the threshold voltage of the switching devices, the power output requirement, and the impedance of the load network. Specifically, by controlling the amplitude of the voltage signals at the inputs of the switching devices, i.e. the gate-source voltage signals, depending on the aforesaid variables, the transition time can be optimized for a particular application to reduce switching losses substantially to zero.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
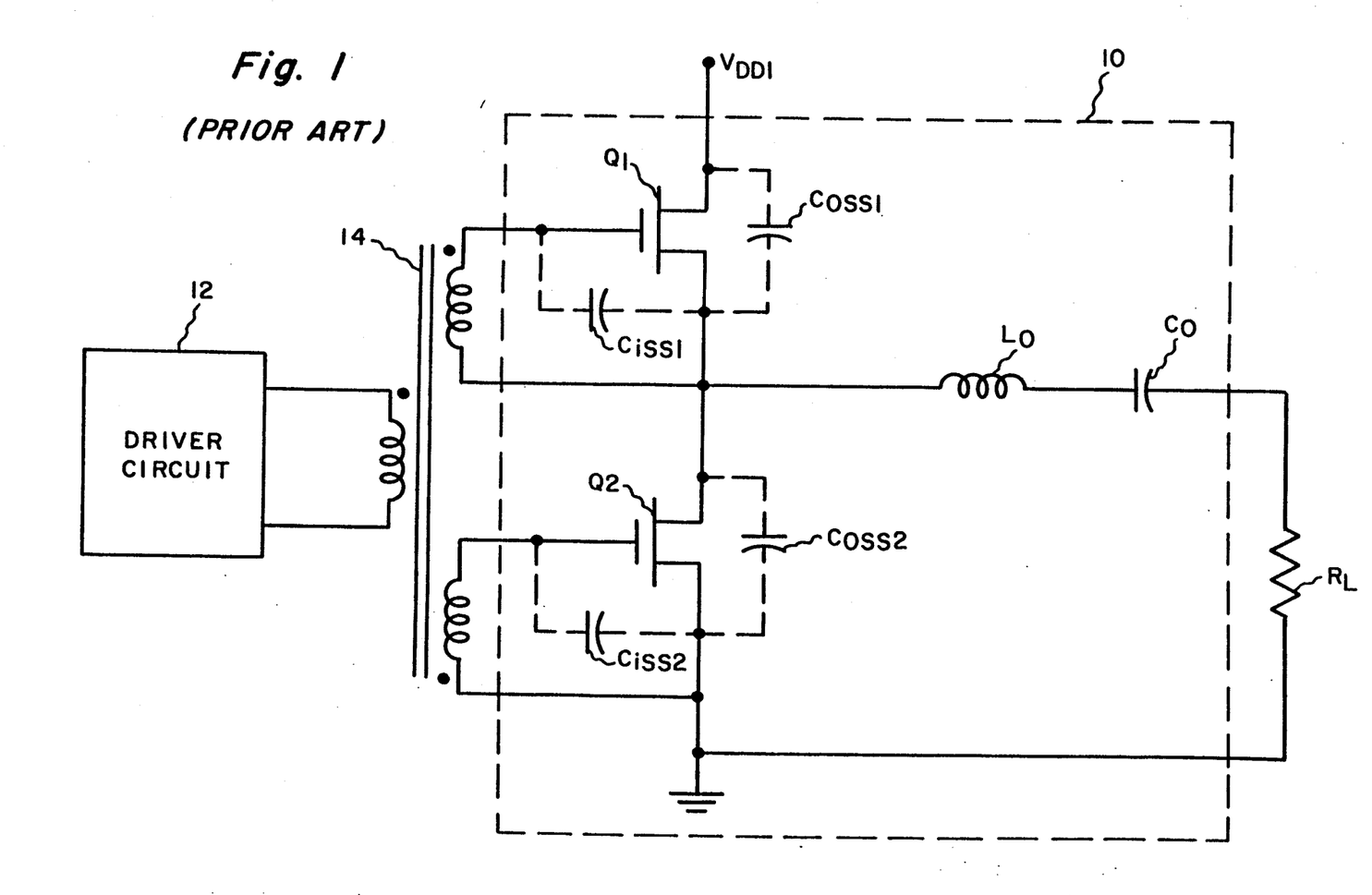
FIG. 1 is a schematic diagram of a conventional voltage-switching Class-D power amplifier.

FIG. 1 illustrates a conventional voltage-switching Class-D power amplifier 10. Two power switching devices $Q_1$ and $Q_2$ are connected in series with a dc power supply $V_{DD1}$ in a half-bridge configuration.

Switching devices $Q_1$ and $Q_2$ are illustrated as MOSFET's, but other types of switching devices having capacitive gates may be used, such as insulated gate bipolar transistors (IGBT's) or MOS-controlled thyristors (MCT's). Each switching device $Q_1$ and $Q_2$ includes an output parasitic capacitance $C_{oss1}$ and $C_{oss2}$ (shown in dashed lines), respectively, and an input parasitic capacitance $C_{iss1}$ and $C_{iss2}$ (also shown in dashed lines), respectively. A load network comprising a series resonant circuit, including an inductor Lo and a capacitor Co, and a load resistance $R_L$, is connected to the half-bridge at the junction between devices $Q_1$ and $Q_2$. A typical driver circuit 12 generates a square wave input signal and is coupled to the gates of MOSFET's $Q_1$ and $Q_2$ by an isolation transformer 14. The isolation transformer causes devices $Q_1$ and $Q_2$ to be driven by square wave voltage signals which are 180° out-of-phase. Ideally, a square wave voltage signal is thus applied to the series resonant circuit. In actuality, due to a finite switching transition time, this voltage signal is generally trapezoidal. For a properly tuned resonant circuit, there is zero reactance at the switching frequency, and the output signal across the load resistance $R_L$ is sinusoidal.

During turn-on of a respective switching device $Q_1$ or $Q_2$, energy is stored in the output capacitance $C_{oss2}$ or $C_{oss1}$ of the other switching device, respectively. When the switching device $Q_1$ or $Q_2$ is turned off, the energy stored in the output capacitance of the other switching device is dissipated. The transition time, or "dead time", $t_d$ is the time between turning off one device and turning on the other device. At low frequencies, the energy lost during the dead time $t_d$ due to discharging the output capacitance is negligible. However, as frequency increases, this energy loss becomes significant.

In accordance with the present invention, a Class-D power amplifier is driven by a sinusoidal driver, and the dead time $t_d$ is optimized to provide zero-voltage switching, thereby improving efficiency, even at high frequencies. As used herein, the term zero-voltage switching is defined as turning on/off at zero voltage across the device and zero current therethrough, i.e., the conditions for lossless switching.

Figure 2:
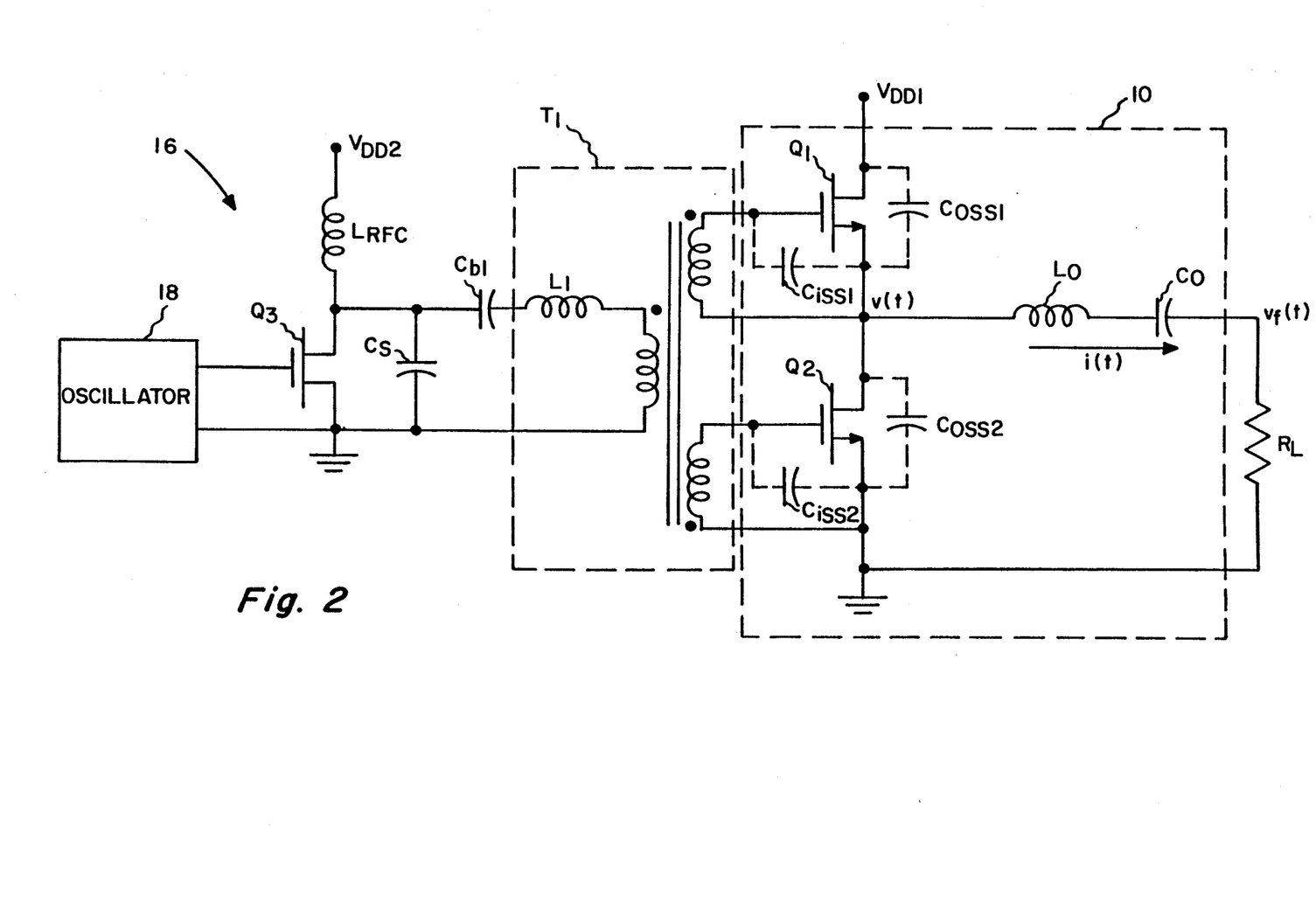
FIG. 2 is a schematic diagram of a Class-D power amplifier and a driver circuit therefor in accordance with a first preferred embodiment of the present invention.

A preferred embodiment of a high efficiency driver 16 of the present invention comprises a high efficiency Class-E power amplifier, as illustrated in FIG. 2. As shown, the Class-E power amplifier 16 employs a single driver switching device $Q_3$ connected in series with a dc power supply $V_{DD2}$. Like switching devices $Q_1$ and $Q_2$, switching device $Q_3$ may comprise a MOSFET. A series resonant circuit, which is coupled to the drain of device $Q_3$, comprises an inductance $L_1$ and a capacitance connected to a load, i.e., the Class-D power amplifier 10. Preferably, the inductance $L_1$ comprises the leakage inductance of an isolation transformer $T_1$ which couples driver 16 to the Class-D power amplifier 10 By so using the parasitic inductance, driver size can be decreased, while efficiency is increased. The capacitance of the series resonant circuit comprises the series combination of a blocking capacitance $C_{b1}$ and the capacitance due to the combination of input parasitic capacitances $C_{iss1}$ and $C_{iss2}$ reflected to the primary of transformer $T_1$. Blocking capacitance $C_{b1}$ is provided to prevent saturation of transformer $T_1$ by blocking application of dc voltage thereto. Since blocking capacitance $C_{b1}$ is typically large compared with the reflected capacitance due to the combination of capacitances $C_{iss1}$ and $C_{iss2}$, the capacitance of the series resonant circuit is effectively equal to the reflected capacitance of the combination of parasitic capacitances $C_{iss1}$ and $C_{iss2}$. The Class-E driver circuit further comprises an RF choke $L_{RFC}$ to ensure that the drain current of device $Q_3$ remains substantially constant. A capacitance $C_s$, which preferably comprises at least a portion of the output parasitic capacitance of device $Q_3$, is employed to shunt the switching device $Q_3$. The driver switching device $Q_3$ is driven by an oscillator 18 that generates a sinewave power signal at a high frequency, e.g. 13.56 MHz, a suitable frequency for driving a Class-D ballast for an electrodeless high intensity discharge lamp. With a sufficiently high quality factor Q, the output voltage from the Class-E driver circuit is sinusoidal.

Figure 3A:
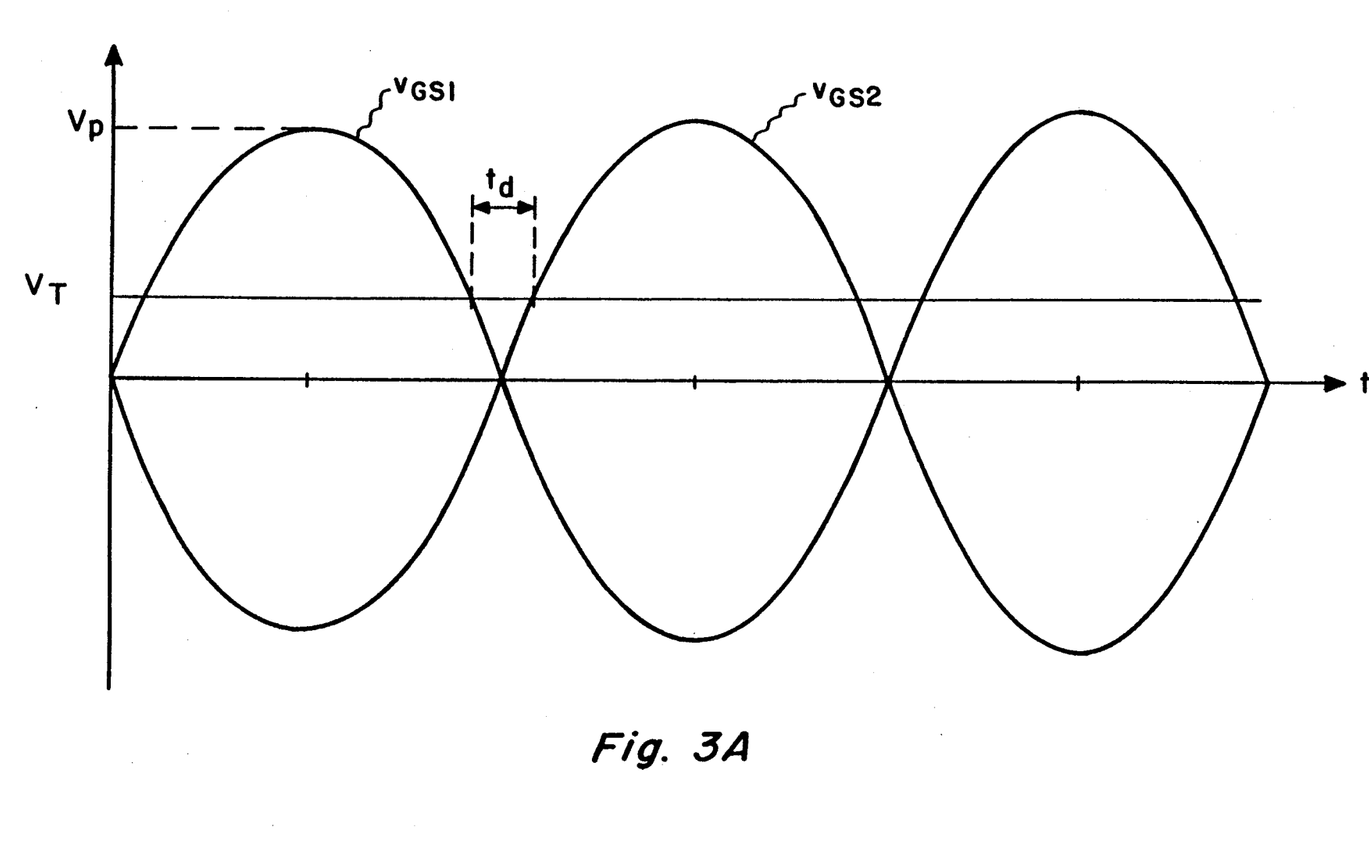
FIGS. 3A–3C are graphical illustrations of voltage and current waveforms useful in describing the operation of the Class-D system of FIG. 2.

FIG. 3A illustrates the 180° out-of-phase sinusoidal gate-source voltage waveforms $v_{Gs1}$ and $v_{Gs2}$, each having an amplitude $V_p$, which result from driving the Class-D amplifier with the illustrated Class-E driver circuit via transformer $T_1$, as shown in FIG. 2. The switching devices $Q_1$ and $Q_2$ are not ideal and thus have a threshold voltage $V_T$ which must be reached before these devices can turn on. The transition time $t_d$ occurring between turn-off of device $Q_1$ and turn-on of device $Q_2$ is illustrated in FIG. 3A. In accordance with the present invention, this transition time is optimized to obtain zero-voltage switching, as will be described hereinafter.

Figure 3B:
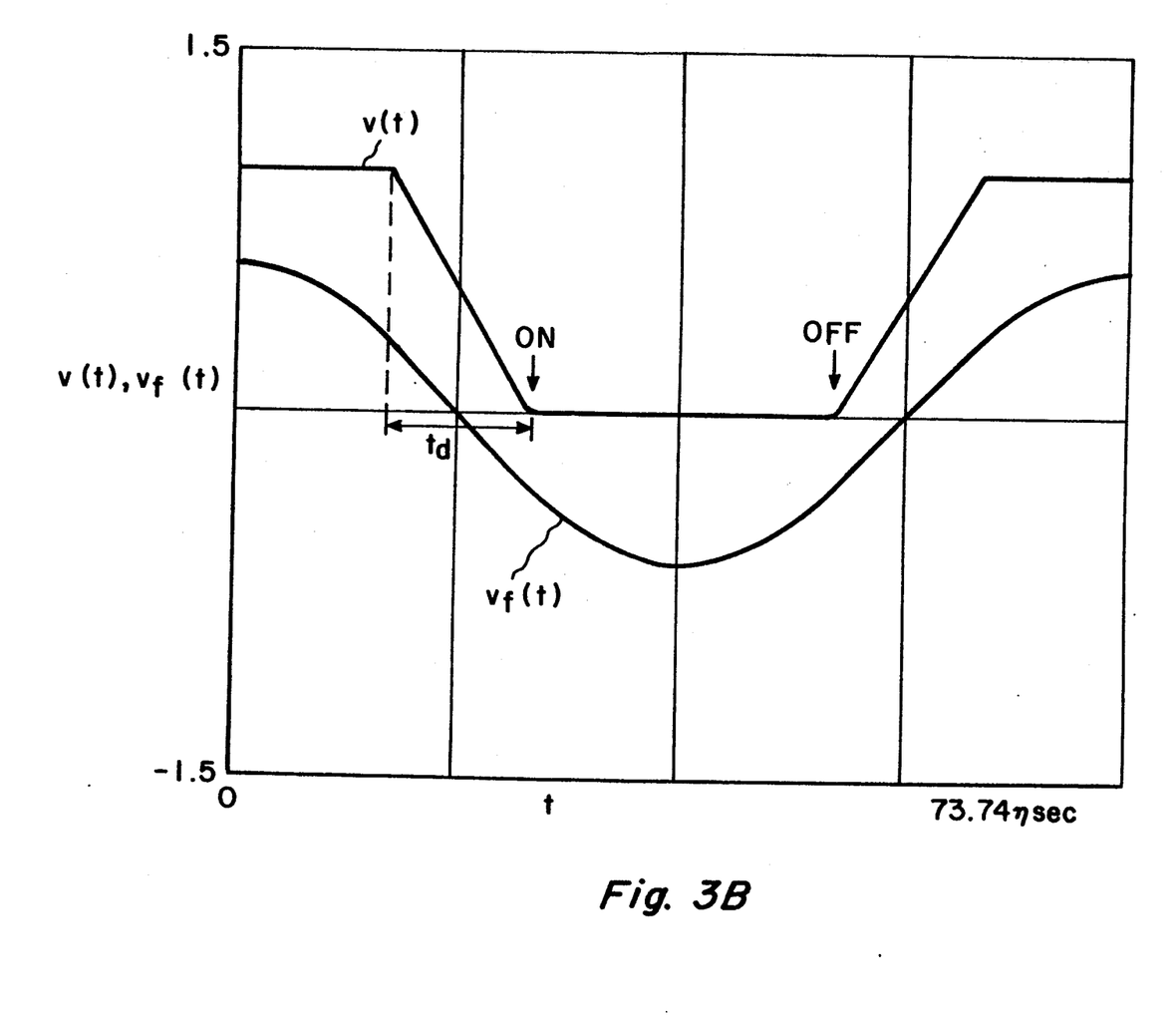

FIG. 3B graphically illustrates the drain voltage waveform v(t) for device $Q_2$ of the Class-D amplifier of FIG. 2, i.e., the voltage at the junction between the two switching devices Q1 and Q2. This voltage waveform is generally trapezoidal. The transition time $t_d$ is the time required for the trapezoidal voltage to transition from its maximum value to its minimum value and vice versa, as shown. FIG. 3B also shows the corresponding fundamental component waveform $v_f(t)$ of the voltage waveform v(t). The amplitude $V_f$ of the fundamental component waveform $v_f(t)$ may be expressed $$V_f = 2\frac{V_{DD1}}{\pi\phi} \sin\phi, \qquad (1)$$

where the load impedance angle $\phi$, in radians, may be expressed in terms of the transition time $t_d$ as follows:

$$\phi = \frac{t_d}{T}\pi, \qquad (2)$$

where T represents the period of the gate-source voltage waveform of the respective switching device.

Figure 3C:
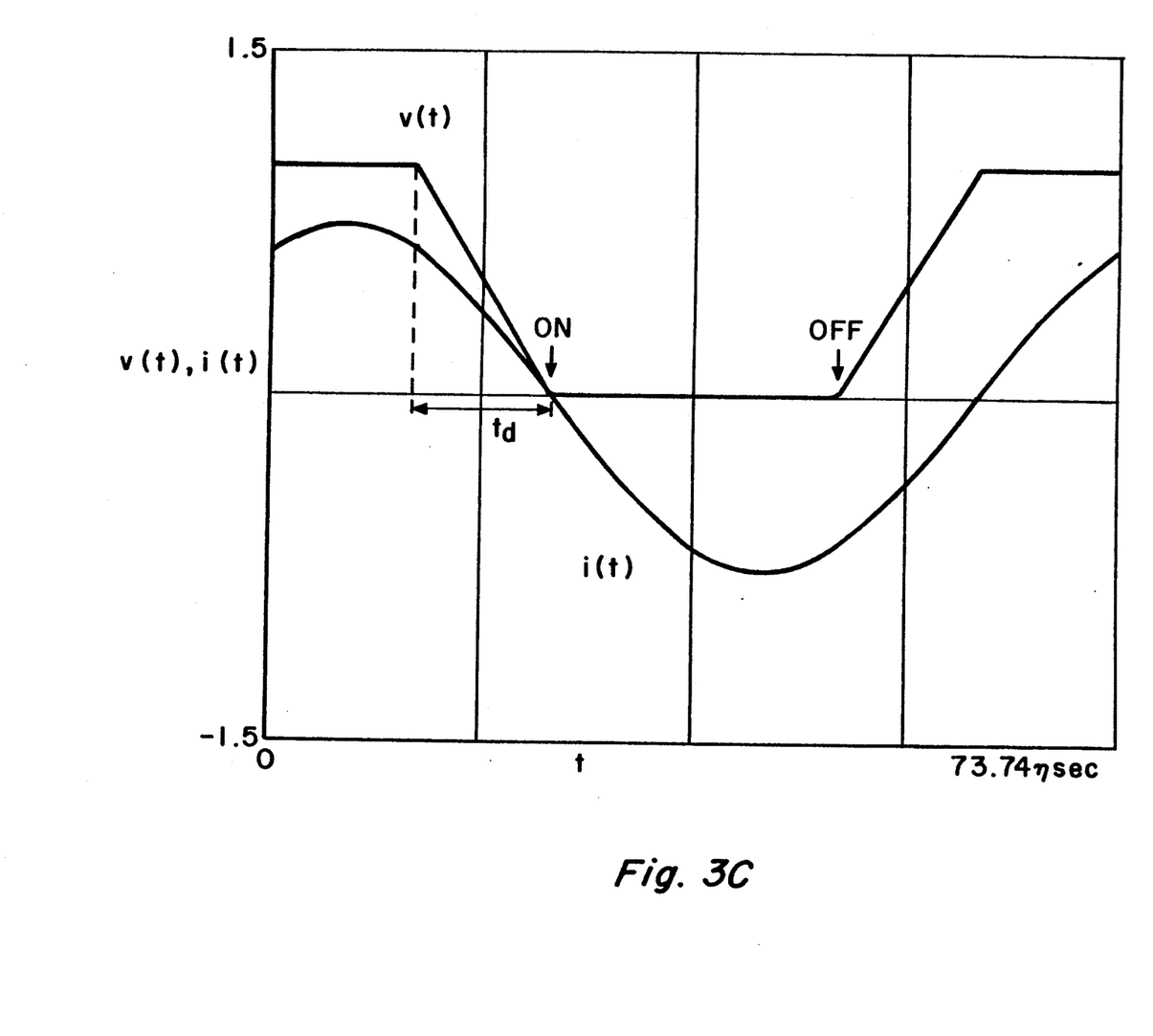

FIG. 3C graphically illustrates the output load current waveform i(t) along with the voltage waveform v(t) under conditions for which zero-voltage switching of the Class-D amplifier of FIG. 2 is attained. In particular, in accordance with the present invention, the transition time $t_d$ is optimized so that switching occurs when the voltage waveform v(t) and the current waveform i(t) intersect at zero. In this way, the output capacitance of each respective switching device is completely discharged at the switching instant, thereby resulting in lossless switching. The following equation describes the discharge of the output capacitance $C_{oss}$ of a switching device of a voltage-switching Class-D power amplifier in terms of transition time $t_d$, operating frequency $\omega$ load impedance angle $\phi$, and peak output current $I_1$:

$$C_{oss} = \frac{I_1}{2V_{DD1}} \int_{\frac{T}{4}-\frac{td}{2}}^{\frac{T}{4}-\frac{td}{2}} \cos(\omega t - \phi) dt. \quad (3)$$

In accordance with the present invention, the transition time $t_d$ is optimized by controlling the amplitude $V_p$ of the sinusoidal gate-source voltage signals $v_{GS1}$ and $v_{GS2}$ depending on: the output capacitances $C_{oss1}$ and $C_{oss2}$; the threshold voltage $V_T$ of the switching devices; the power output requirement; and the impedance of the resonant load network. In particular, the output power $P_o$ may be expressed as follows:

$$P_o = \tfrac{1}{2} V_p I_1 \cos\phi. \quad (4)$$

Furthermore, by integrating equation (3) and rearranging terms, the dc power supply voltage Vool may be expressed as follows:

$$V_{DD1} = \frac{i(t)}{2\omega C_{oss}}(1 - \cos 2\phi). \quad (5)$$

Equations (1), (4), and (5) may be solved to yield an expression for the peak output current $I_1$ of the Class-D power amplifier as follows:

$$I_1 = \sqrt{\frac{4\pi P_o \omega C_{oss}\phi}{(1-\cos 2\phi)\sin 2\phi}}. \quad (6)$$

Figure 4:
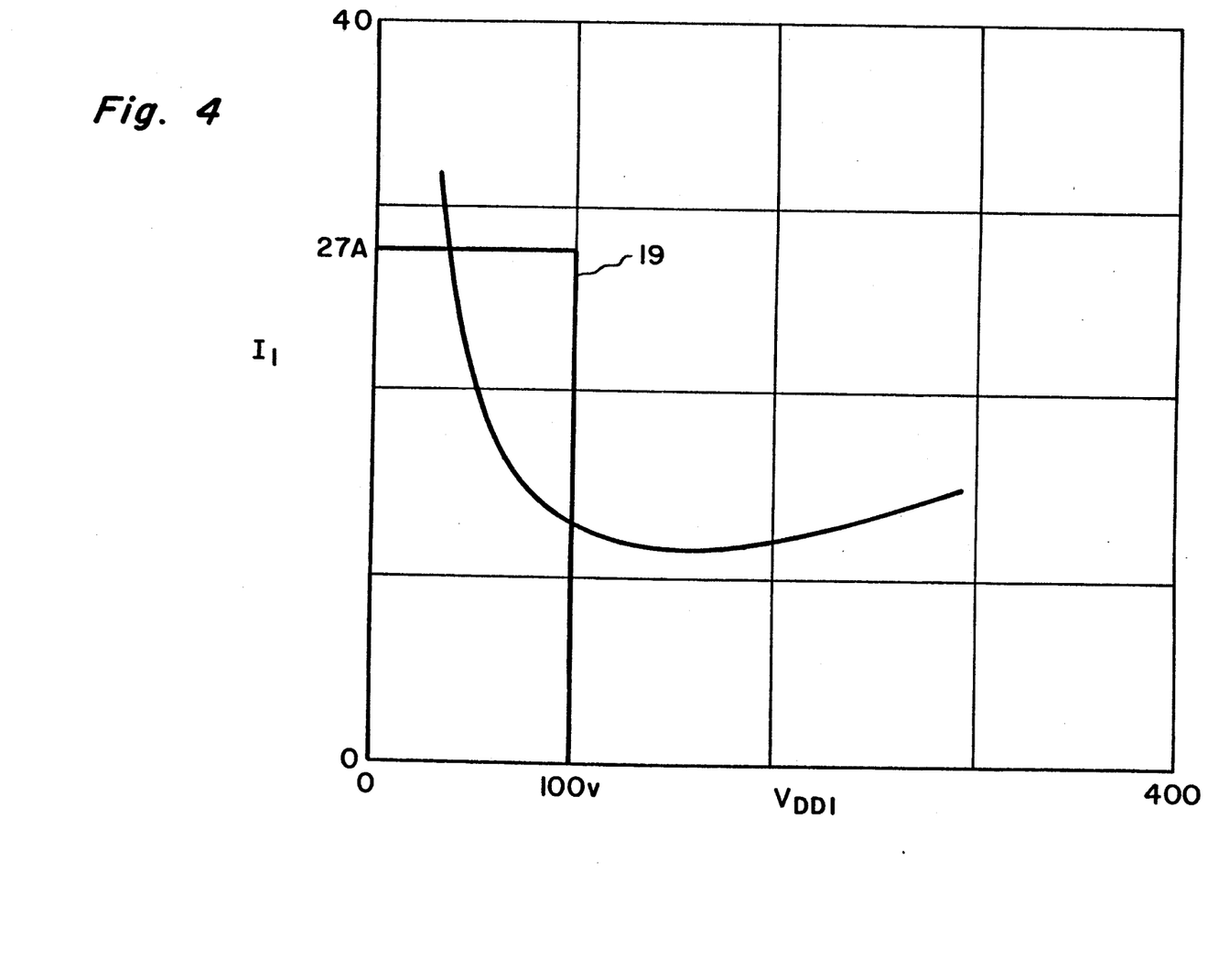
FIG. 4 is a graphical illustration of peak output current versus dc power supply voltage for a type IRF 140 MOSFET employed in a Class-D power amplifier such as that of FIG. 2.
Figure 5:
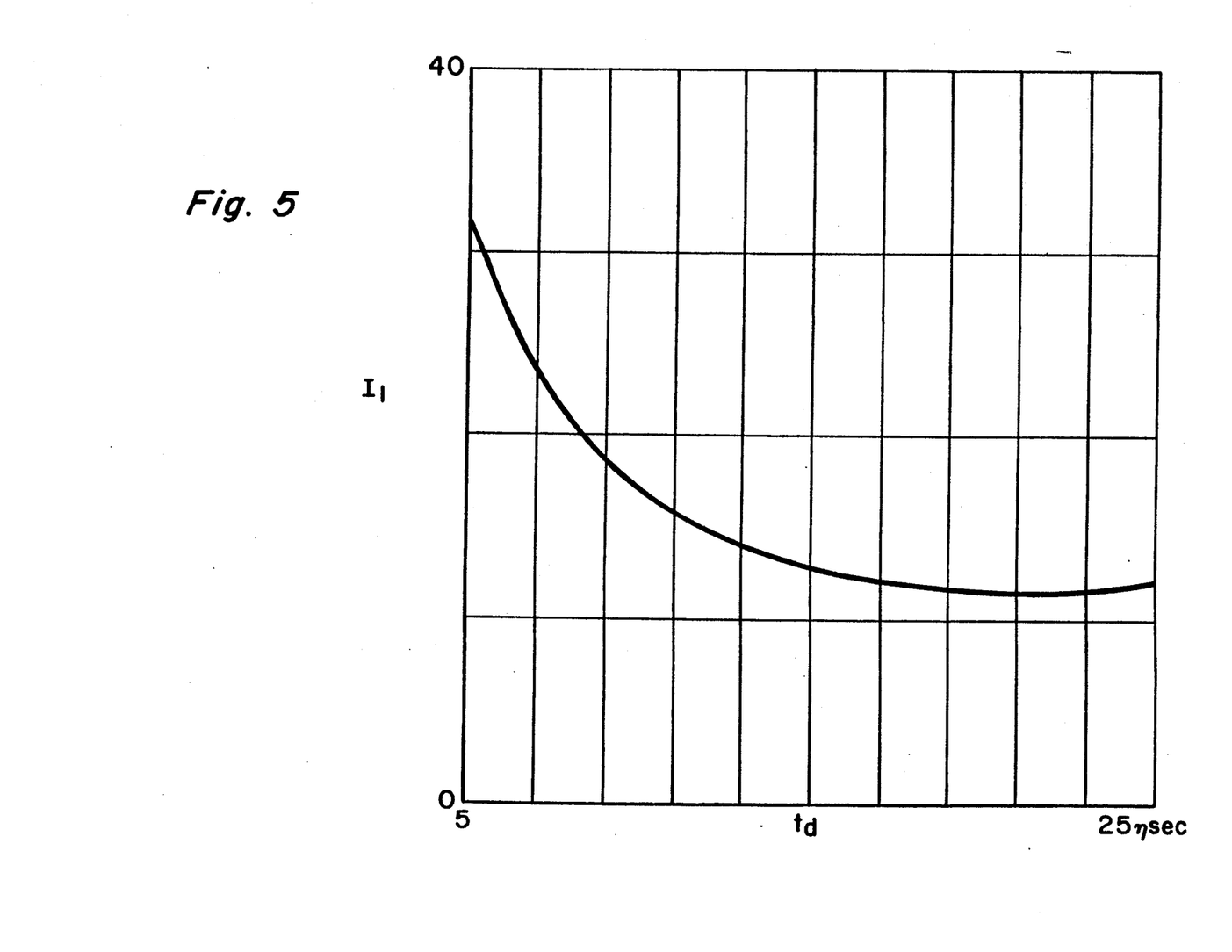
FIG. 5 is a graphical illustration of dc power supply voltage versus optimum transition time for a type IRF 140 MOSFET employed in a Class-D power amplifier such as that of FIG. 2.
Figure 6:
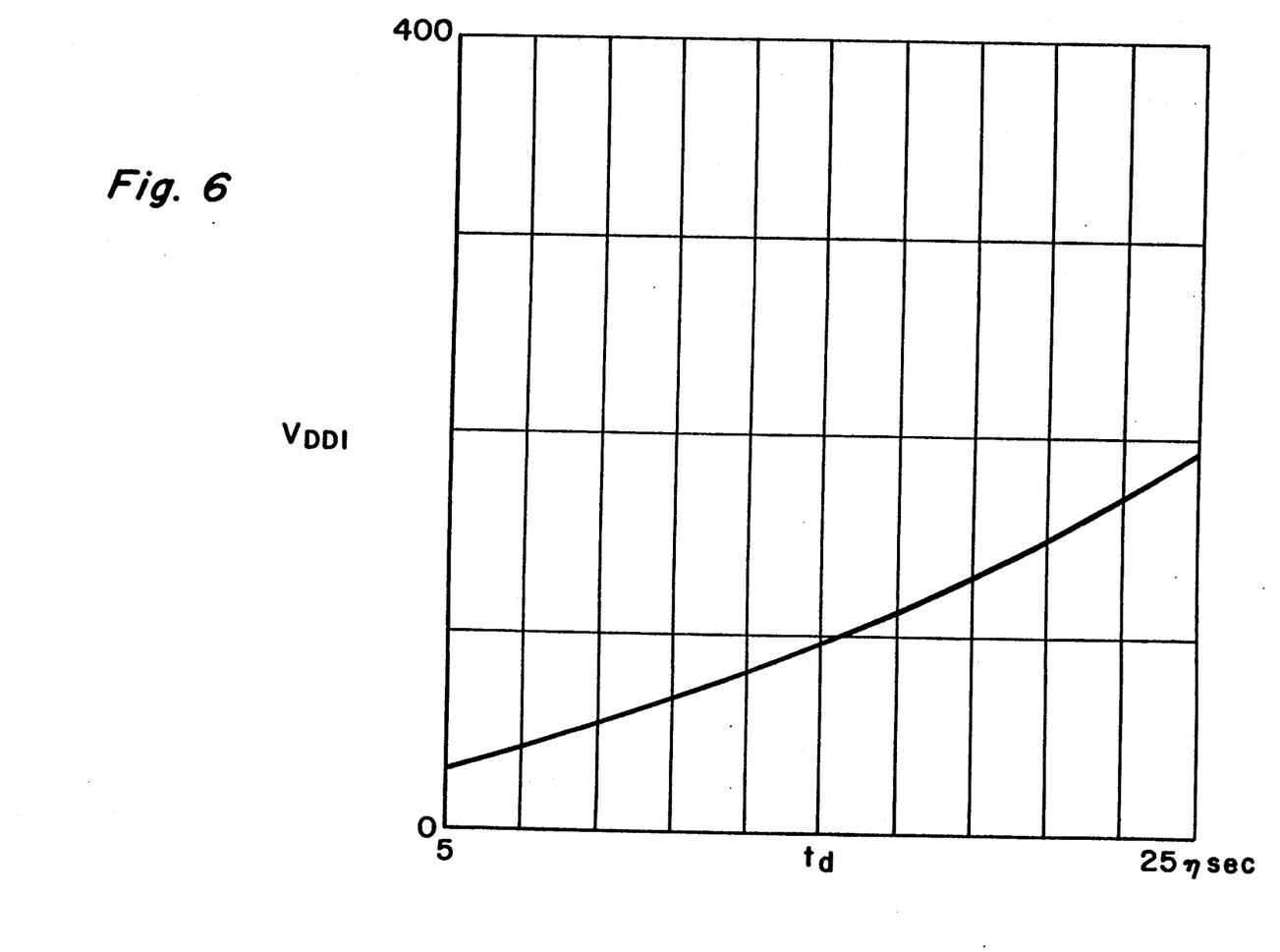
FIG. 6 is a graphical illustration of peak output current versus optimum transition time for a type IRF 140 MOSFET employed in a Class-D power amplifier such as that of FIG. 2.

FIG. 4 is a graph of peak output current $I_1$ versus dc power supply voltage $V_{DD1}$ for a type IRF 140 MOSFET manufactured by International ReCtifier Corporation which may used to implement switching devices $Q_1$ and $Q_2$ of the Class-D power amplifier 10 of FIG. 2. Using the graph of FIG. 4, an operating point comprising values for supply voltage $V_{DD1}$ and peak output current $I_1$ may be selected. In particular, safe operating points for a type IRF 140 MOSFET are found within the bounded region 19. FIGS. 5 and 6, respectively, are graphs of the peak output current $I_1$ and the dc supply voltage $V_{DD1}$ versus the optimum transition time $t_d$ for type IRF 140 MOSFET's. The graphs of FIGS. 4–6 were generated using equations (1)–(6). By interpolating between the two transition time curves, i.e., FIGS. 5 and 6, the optimum transition time $t_d$ may be approximated for a selected operating point, i.e., specific values of peak output current $I_1$ and dc supply voltage $V_{DD1}$. Knowing the value of the optimum transition time $t_d$, the amplitude $V_p$ of the gate-source voltage signals $v_{GS1}$ and $v_{GS2}$ needed to provide this optimum transition time $t_d$ can be determined acCording to the following equation:

$$V_p = \frac{V_T}{\sin\left[\omega \frac{td}{2}\right]}. \quad (7)$$

Finally, design of oscillator 18 for generating an input signal to produce gate-source voltage signals $v_{GS1}$ and $v_{GS2}$ having amplitude Vp at the required operating frequency is a matter well-known in the art.

Figure 7:
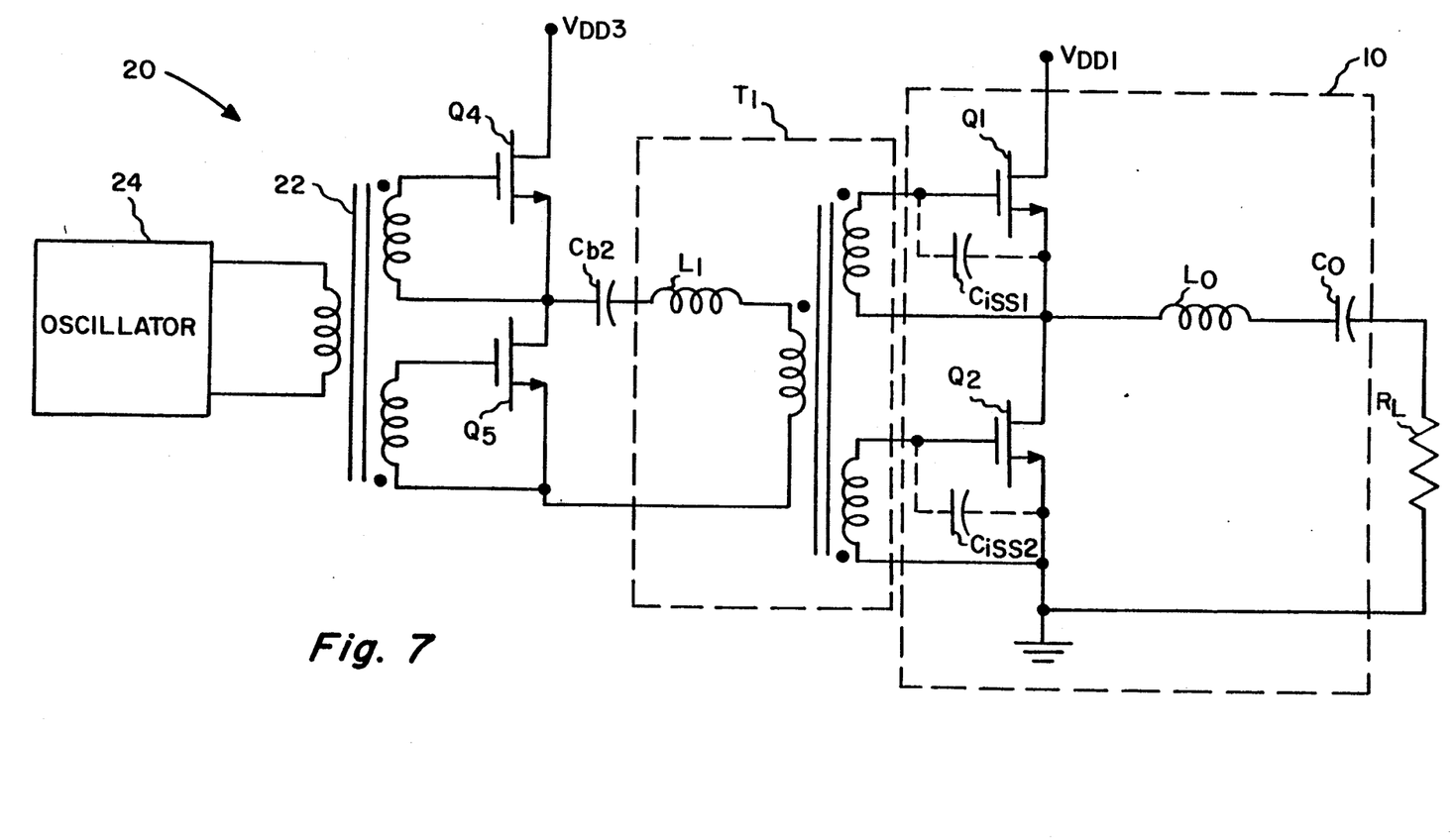
FIG. 7 is a schematic diagram of a Class-D power amplifier and a driver circuit therefor in accordance with a second preferred embodiment of the present invention.

A second preferred embodiment of a driver circuit for a high frequency Class-D power amplifier comprises another Class-D amplifier stage 20, as illustrated in FIG. 7, for which the amplitude of the sinusoidal gate-source voltage signals is controlled such that the transition time $t_d$ is optimized in accordance with the principles of the present invention. Such a Class-D driver circuit comprises two switching devices $Q_4$ and $Q_5$ connected in series with a dc power supply VDD3 in a half-bridge configuration. A series resonant circuit is connected to the half-bridge at the junction between switching devices $Q_4$ and $Q_5$. The series resonant circuit comprises an inductance $L_1$ and the series combination of a blocking capacitance $C_{b2}$ and the reflected capacitance due to the input parasitic capacitances $C_{iaa1}$ and $C_{iss2}$ of switching devices $Q_1$ and $Q_2$. Since blocking capacitance $C_{b2}$ is typically large, compared with the reflected capacitance due to the combination of capacitances $C_{iss1}$ and $C_{iss2}$, the capacitance of the series resonant circuit is effectively equal to the reflected capacitance of the combination of parasitic capacitances $C_{iss1}$ and $C_{iss2}$. The inductance $L_1$ preferably comprises the leakage inductance of the isolation transformer $T_1$. The Class-D driver circuit is driven via a transformer 22 by an oscillator 24.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A driver for a high efficiency Class-D voltage-switching power amplifier of the type having first and second switching devices connected in series in a half-bridge configuration and including an output resonant circuit at the junction between said first and second switching devices, said output resonant circuit comprising a capacitance connected in series with an inductance, said first and second switching devices each having an input capacitance and an output capacitance, said driver comprising:

sinewave signal generating means for providing an input sinewave power signal to said firs and second switching devices so as to produce sinusoidal voltage signals of predetermined amplitude at the inputs of said first and second switching devices in order to control the transition time between turn-off of one of said first and second switching devices and turn-on of the other one of said switching devices in order to ensure that the output capacitance of said other one of said switching devices is substantially discharged and further that turn-on of said one of said switching devices occurs when there is substantially zero voltage thereacross and substantially zero current therethrough, thereby resulting in substantially lossless switching; and oscillator means for driving said sinewave signal generating means.

2. The drive of claim 1 wherein:

said sinewave signal generating means comprises a transformer having a leakage inductance, a Class-E power amplifier coupled to said Class-D power amplifier by said transformer, said Class-E power amplifier comprising a third switching device having a shunt capacitance connected in parallel combination therewith, and an RF choke means, said parallel combination being connected in series with said RF choke means, and a second resonant circuit being connected at the junction between said third switching device and said RF choke means, said second resonant circuit comprising a second capacitance connected in series with a second inductance.

3. The driver of claim 2 wherein said second inductance comprises said leakage inductance.

4. The driver of claim 2 wherein said second capacitance comprises a blocking capacitance in series with each said input capacitance of said first and second switching devices, said blocking capacitance functioning to block application of dc voltage to said transformer.

5. The driver of claim 1 wherein:
said sinewave signal generating means comprises a second Class-D power amplifier coupled to said high efficiency Class-D power amplifier by a transformer having a leakage inductance, said second Class-D power amplifier including third and fourth switching devices connected in series in a half-bridge configuration, said second Class-D power amplifier comprising a second resonant circuit including an additional capacitance connected in series with an additional inductance.

6. The driver of claim 5 wherein said additional inductance comprises said leakage inductance.

7. The driver of claim 5 wherein said additional capacitance comprises a blocking capacitance in series with each said input capacitance of said firs and second switching devices, respectively, said blocking capacitance functioning to block application of dc voltage to said transformer.

8. The driver of claim 1 further comprising means coupled to said sinewave generating means for generating from said input sinewave power signal two sinewave signals which are substantially 180° out-of-phase, each one of said two sinewave signals being supplied to one of said first and second switching devices, respectively.

9. The driver of claim 1 wherein said first and second switching devices each comprises a MOSFET.

10. The driver of claim 1 wherein said first and second switching devices each comprises an insulated gate bipolar transistor.

* * * * *